(12) United States Patent
Cho et al.

(10) Patent No.: US 10,269,423 B2
(45) Date of Patent: Apr. 23, 2019

(54) ACCESS METHODS OF MEMORY DEVICE USING RELATIVE ADDRESSING

(71) Applicant: Samsung Electronics Co., Ltd., Suwon-si, Gyeonggi-do (KR)

(72) Inventors: Youngjin Cho, Seoul (KR); Jinwoo Kim, Seoul (KR); Jaegeun Park, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/360,134

(22) Filed: Nov. 23, 2016

(65) Prior Publication Data

US 2017/0153825 A1     Jun. 1, 2017

(30) Foreign Application Priority Data

Nov. 27, 2015    (KR) ........................ 10-2015-0167581

(51) Int. Cl.
| | |
|---|---|
| *G06F 12/02* | (2006.01) |
| *G11C 13/00* | (2006.01) |
| *G11C 8/18* | (2006.01) |
| *G11C 11/16* | (2006.01) |
| *G11C 11/22* | (2006.01) |
| *G06F 13/16* | (2006.01) |
| *G11C 8/10* | (2006.01) |

(52) U.S. Cl.
CPC ...... *G11C 13/0023* (2013.01); *G06F 12/0246* (2013.01); *G11C 8/18* (2013.01); *G11C 11/1653* (2013.01); *G11C 11/2253* (2013.01); *G06F 13/1668* (2013.01); *G11C 8/10* (2013.01); *G11C 2207/2245* (2013.01)

(58) Field of Classification Search
CPC .................................................. G06F 12/0246
See application file for complete search history.

(56) References Cited

U.S. PATENT DOCUMENTS

| | | |
|---|---|---|
| 5,392,252 A | 2/1995 | Rimpo et al. |
| 5,497,474 A | 3/1996 | Todorovich |
| 7,072,237 B2 | 7/2006 | Morgan et al. |
| 7,269,825 B1 | 9/2007 | Adcock |
| 7,464,207 B2 | 12/2008 | Riley et al. |
| 7,679,133 B2 | 3/2010 | Son et al. |
| 7,805,589 B2 | 9/2010 | Du et al. |
| 8,553,466 B2 | 10/2013 | Han et al. |
| 8,559,235 B2 | 10/2013 | Yoon et al. |
| 8,654,587 B2 | 2/2014 | Yoon et al. |
| 8,730,759 B2 | 5/2014 | Walker |
| 8,792,404 B2 | 7/2014 | Ajanovic et al. |
| 2011/0078359 A1 | 3/2011 | Van Dyke |
| 2011/0233648 A1 | 9/2011 | Seol et al. |
| 2014/0325129 A1* | 10/2014 | Ahlquist ............. G06F 12/0246 711/103 |

* cited by examiner

*Primary Examiner* — Edward J Dudek, Jr.
(74) *Attorney, Agent, or Firm* — Myers Bigel, P.A.

(57) ABSTRACT

A method for accessing a random-accessible nonvolatile RAM includes externally receiving a base address, receiving a relative address corresponding to an increasing or decreasing size from the base address, and reading data stored in a memory area of the nonvolatile RAM or writing externally provided data into the nonvolatile RAM with reference to the base address and the relative address.

14 Claims, 14 Drawing Sheets

112

| Stream ID | Last Sending Address | | Option |
|---|---|---|---|
| | Base Address | Relative Address | |
| S_ID1 | 110 | 150 | + |
| S_ID4 | 240 | 300 | + |
| S_ID5 | 500 | 200 | − |
| S_ID7 | 720 | 400 | − |
| | | | |
| | | | |

| Stream ID | Last Sending Address | | Option |
|---|---|---|---|
| | Base Address | Relative Address | |
| S_ID1 | 110 | 150 | + |
| S_ID4 | 240 | 300 | + |
| S_ID5 | 500 | 200 | − |
| S_ID7 | 720 | 400 | − |
| | | | |
| | | | |

ACCESS METHODS OF MEMORY DEVICE USING RELATIVE ADDRESSING

CROSS-REFERENCE TO RELATED APPLICATIONS

This US non-provisional patent application claims priority under 35 USC § 119 to Korean Patent Application No. 10-2015-0167581, filed on Nov. 27, 2015, the entirety of which is hereby incorporated by reference.

BACKGROUND

The present disclosure relates to semiconductor memories and, more particularly, to access methods of a memory device using relative addressing.

Semiconductor memory devices are typically implemented using semiconductors such as silicon (Si), germanium (Ge), gallium arsenide (GaAs), and indium phosphide (InP). In general, semiconductor memory devices are classified into volatile memory devices and nonvolatile memory devices.

In recent years, many efforts have been made to use a nonvolatile memory as a main memory. Compatibility with a conventional DRAM-based main memory needs to be considered in a system using a nonvolatile memory as a main memory. There is a need for an access method capable of enhancing bus efficiency while providing compatibility with a DRAM.

SUMMARY

A method for accessing a random-accessible nonvolatile RAM according to example embodiments of inventive concepts may include externally receiving a base address, receiving a relative address corresponding to an increasing or decreasing size from the base address, and reading data stored in a memory area of the nonvolatile RAM or writing externally provided data into the nonvolatile RAM with reference to the base address and the relative address.

A method for accessing a random-accessible nonvolatile RAM according to example embodiments of inventive concepts may include receiving an access request for access to the nonvolatile RAM, determining whether a stream ID corresponding to the access request is in a relative address table, generating a base address and a relative address corresponding to an increase or decrease in size from the base address with reference to a last sending address corresponding to the stream ID when the stream ID exists in the relative address table, and sending the base address and the relative address to the nonvolatile RAM.

Some embodiments of the inventive concept include a method for accessing a random-accessible nonvolatile RAM. The method may include receiving a set command indicating an operation for accessing the nonvolatile RAM, receiving a base address in the same clock cycle as the receiving the set command, receiving, a relative address indicating an offset from the base address, and accessing an access location in the nonvolatile RAM based on the base address and relative address.

In some embodiments, the method may include receiving a stream ID in the same clock cycle as the receiving the set command and the receiving the base address. The stream ID may correspond to characteristics a read/write command. A base address table may be used to decode the access location in the nonvolatile RAM based on the base address, the relative address, and the stream ID.

In some embodiments, the read/write command may include a read request or a write operation. The read/write command may be received prior to receiving an additional set command. The read/write command may be received after receiving the base address. The relative address may be received in a same clock cycle as the read/write command.

In some embodiments, the method may include receiving a read/write command indicating an operation for accessing the nonvolatile RAM. The read/write command may be a read request. The method may include determining an access address of the access location in the nonvolatile RAM based on one of a positive offset by the relative address from the base address or a negative offset by the relative address from the base address, and providing data from the access location in the nonvolatile RAM responsive to the read request and the access address of the access location in the nonvolatile RAM.

In some embodiments, the relative address includes a first relative address, the offset from the base address includes a first offset from the base address, the access address includes a first access address, the access location includes a first access location, and the data includes a first data. The method may include receiving, prior to receiving an additional set command a second relative address indicating a second offset from the base address. The method may include determining a second access address of the second access location in the nonvolatile RAM based on one of a positive offset by the second relative address from the base address or a negative offset by the second relative address from the base address, and providing second data from the second access location in the nonvolatile RAM responsive to the read request and the second access address of the second access location in the nonvolatile RAM.

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below.

BRIEF DESCRIPTION OF THE DRAWINGS

The forgoing and other features of inventive concepts will be described below in more detail with reference to the accompanying drawings of non-limiting example embodiments of inventive concepts in which like reference characters refer to like parts throughout the different views. The drawings are not necessarily to scale, emphasis instead being placed upon illustrating principles of the inventive concepts. In the drawings:

FIG. 3 illustrates a relative address table formed in a memory controller in FIG. 1;

DETAILED DESCRIPTION

Figure 1:
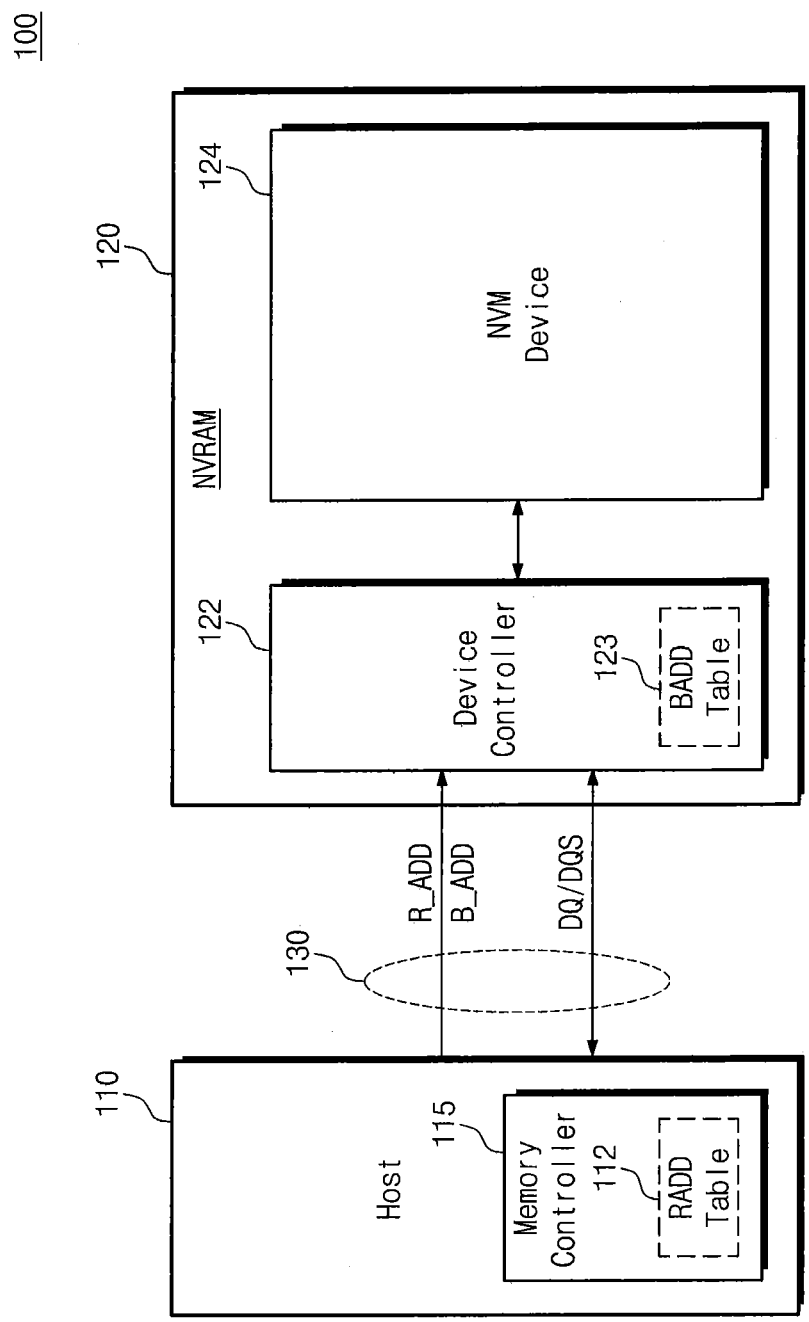
FIG. 1 is a block diagram of a memory system according to example embodiments of inventive concepts.

Example embodiments will now be described more fully with reference to the accompanying drawings, in which some example embodiments are shown. In the drawings, the thicknesses of layers and regions are exaggerated for clarity. Like reference numerals in the drawings denote like elements.

Detailed illustrative example embodiments are disclosed herein. However, specific structural and functional details disclosed herein are merely representative for purposes of describing example embodiments. Example embodiments may be embodied in many alternate forms and should not be construed as limited to only those set forth herein.

It should be understood, however, that there is no intent to limit this disclosure to the particular example embodiments disclosed. On the contrary, example embodiments are to cover all modifications, equivalents, and alternatives falling within the scope of the example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of this disclosure. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some implementations, the functions/acts noted may occur out of the order noted in the figures. For example, two figures shown in succession may in fact be executed substantially concurrently or may sometimes be executed in the reverse order, depending upon the functionality/acts involved.

Various example embodiments will now be described more fully with reference to the accompanying drawings in which some example embodiments are shown. In the drawings, the thicknesses of layers and regions are exaggerated for clarity.

FIG. 1 is a block diagram of a memory system 100 according to example embodiments of inventive concepts. As illustrated, the memory system 100 includes a host 110 and a nonvolatile RAM 120 that are connected to a memory bus 130. The nonvolatile memory 120 may include a single memory device or a memory module.

The host 110 may process data or control components included in the memory system 100. For example, the host 110 may drive various operating systems (OS) and execute various applications on the operating system (OS). The host 110 may write data into the nonvolatile RAM 120 or read data stored in the nonvolatile RAM 120. The host 110 may load data in the nonvolatile RAM 120 and perform various operations using the loaded data. For example, the host 110 may include a central processing unit (CPU) to control the memory system 100.

The host 110 may include a memory controller 115 to control the nonvolatile RAM 120. The host 110 may transmit a read request to the memory controller 115 to read data stored in the nonvolatile RAM 120. The memory controller 115 may access the nonvolatile RAM 120 to read data that the host 110 requests. The memory controller 115 may generate a relative address R_ADD to access the nonvolatile RAM 120. The memory controller 115 may form a relative address table 112 to generate the relative address R_ADD and maintain and update the relative address table 112.

The memory controller 115 may allocate a stream ID according to characteristics of write requests generated in the host 110. The stream ID may be allocated according to each of multi-cores or applications to issue an access request. Alternatively, the stream ID may be allocated in units of threads or tasks. The memory controller 115 may store information on the last access point to each allocated stream ID. Accordingly, when receiving an access request corresponding to a single specific stream ID, the memory controller 115 may transmit a relative address R_ADD for the last access point to the nonvolatile RAM 120. In addition, the memory controller 115 may transmit a base address B_ADD, which is the base of the relative address R_ADD, to the nonvolatile RAM 120 at a specific time. Hereinafter, a relative addressing scheme will be described with a manner of using a base address B_ADD and a relative address R_ADD provided as a relative value to the base address B_ADD. However, it shall be understood that the relative addressing scheme may be used with a manner of using a last address and a relative address.

The nonvolatile RAM 120 includes a device controller 122 and a nonvolatile memory device 124. The device controller 122 may receive the relative address R_ADD from the host 110 to access the nonvolatile memory device 124. The device controller 122 may access a memory area of a position increasing or decreasing by the relative address R_ADD with reference to a base address table 123. The device controller 122 may update the last access point to the base address table 123.

The nonvolatile memory device 124 may include a nonvolatile memory device that is capable of performing an overwrite operation or a nonvolatile memory device that is incapable of preforming an overwrite operation. The nonvolatile device 124 may be implemented with at least one of various memories such as an electrically erasable and programmable ROM (EEPROM), a NAND flash memory, a NOR flash memory, a phase-change RAM (PRAM), a resistive RAM (ReRAM), a ferroelectric RAM (FRAM), and a spin-transfer torque magnetic RAM (STT-MRAM).

In example embodiments of inventive concepts, a three-dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In example embodiments of inventive concepts, the 3D memory array includes vertical NAND strings that are vertically oriented such that at least one memory cell is located over another memory cell. The at least one memory cell may comprise a charge trap layer. Each vertical NAND string may include at least one select transistor located over the memory cells, the at least one select transistor having the same structure as the memory cells and being formed monolithically together with the memory cells.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

The memory bus 130 may provide a path to exchange data, a control signal, a clock or the like between the host 110 and the nonvolatile RAM 120. The memory bus 130 may include at least one of, for example, DDR, DDR2, DDR3, DDR4, LPDDR (Low Power DDR), UFS (Universal Flash Storage), and NVMe (Nonvolatile Memory express).

With the above-described configuration, the memory system 100 according to example embodiments of inventive concepts may significantly reduce a bus occupancy required to substantially transmit an address as a relative address is used. Moreover, a bus protocol for sending the relative address may provide full compatibility with a conventional DRAM bus manner. Accordingly, a nonvolatile RAM 120 with improved address transmission efficiency may be implemented by applying the relative addressing scheme according to example embodiments of inventive concepts.

Figure 2:
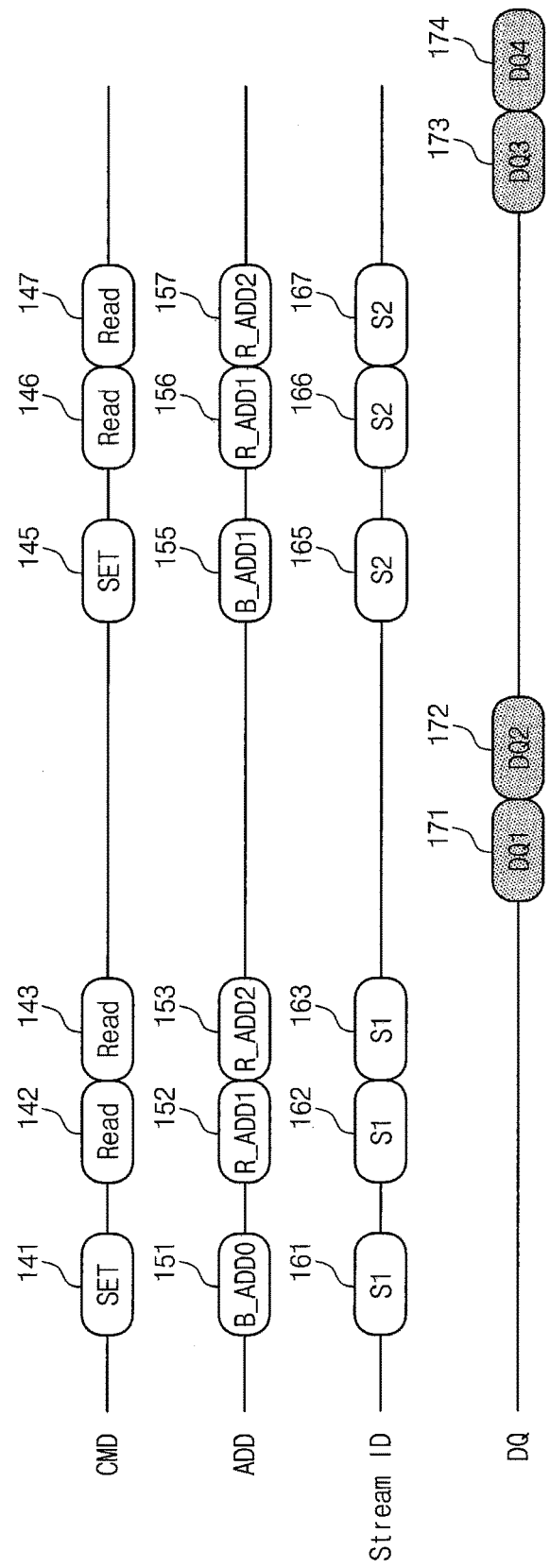
FIG. 2 is a timing diagram illustrating a relative addressing scheme of the memory system in FIG. 1.

FIG. 2 is a timing diagram illustrating a relative addressing scheme of the memory system 100 in FIG. 1. Referring to FIG. 2, the memory system 100 may access the nonvolatile RAM 120 using a base address B_ADD and a relative address R_ADD. An access manner according to example embodiments of inventive concepts will be described by giving a read operation as an example.

The memory controller 115 of FIG. 1 may transmit a command for setting the base address B_ADD to the nonvolatile RAM 120. That is, the memory controller 115 may transmit a command/address for setting a base address B_ADD0 corresponding to a stream ID S1 to the device controller 122 with reference to the relative address table 112. That is, the memory controller 115 may transmit a set command 141, a base address 151, and a stream ID 161 in the same clock cycle. Then base address (B_ADD0) 151 corresponding to the stream ID (S1) 161 may be set to the base address table 123 of the device controller 122.

Read command set corresponding to relative addresses R_ADD1 and R_ADD2 may be sequentially provided, respectively. That is, a read command 142 for a memory area may be provided, which includes a base address (B_ADD0) 151 and a first relative address (R_ADDR1) 152 added to the base address (B_ADD0) 151. Also a stream ID S1 162 corresponding to the base address (B_ADD0) 151 may be provided. In addition, a read command 143 for data at a position migrating by a second relative address (R_ADD2) 153 may be successively provided, which includes the base address (B_ADD0) 151 and the second relative address (R_ADD2) 153. Also the same stream ID S1 163 corresponding to the base address (B_ADD0) 151 may be provided.

When the memory bus 130 uses a DDR-type protocol, a set command (SET) 141 may be provided using an active command Active. The stream ID S1 may correspond to a bank address input cycle, and the base address (B_ADD0) 151 may correspond to a row address input cycle. Each of the read commands 142 and 143 may correspond to a read command cycle, and each of the relative commands 152 and 153 may correspond to a column address input cycle. Read data corresponding to the above-mentioned relative addresses R_ADD1 and R_ADD2 may be output to the host 110 through a data line DQ during data output cycles 171 and 172, respectively.

When receiving a read request of data corresponding to a stream ID S2, the memory controller 115 may transmit a command for setting a new stream ID 165 and a base address B_ADD1 to the nonvolatile RAM 120. The memory controller 115 may transmit a command/address for setting the stream ID S2 and the base address B_ADD1 to the device controller 122 by using an active command cycle. That is, the memory controller 115 may transmit the set command 145, the base address 155, and the stream ID (S2) 165 to the device controller 122. Then the base address (B_ADD1) 155 corresponding to the stream ID (S2) 165 may be set to the base address table 123.

Read command set corresponding to the relative addresses 156 and 157 may be sequentially provided. That is, a read command 146 for data at a position migrating by the first relative address (R_ADD1) 156 may be provided, which includes the base address (B_ADD1) 155 and the first relative address (R_ADD1) 156. Also the same stream ID (S2) 166 corresponding to the base address (B_ADD0) 155 may be provided. In addition, a read command 147 for data at a position migrating by a second relative address (R_ADD2) 157 may be successively provided, which includes the base address (B_ADD0) 155 and the second relative address (R_ADD2) 157. Also the same stream ID (S2) 167 corresponding to the base address (B_ADD0) 155 may be provided. Read data of the relative addresses R_ADD0 and R_ADD2 corresponding to the above-mentioned stream ID S2 may be output to the host 110 through a data line DQ during data output cycles 173 and 174, respectively.

According to the above-described relative addressing scheme, an additional access command has only to provide a relative command for the same base address B_ADDx. That is, in case of the nonvolatile RAM 120, similar to a DRAM, a command sequence to activate a row may be omitted. Since the nonvolatile RAM 120 need not be managed in unit of a single row, only a column position changed using only a relative address may be provided to read data during a successive read operation. The relative address may be provided without limitation to the boundary of a single row. That is, when successive address values are allocated to different rows of a nonvolatile memory, data of a plurality of rows may also be accessed through a single base address and a single relative address.

In the above-described method for transmitting a relative address according to example embodiments of inventive concepts, the relative address is a relative value that indicates an increasing size of an address on the basis of a base address B_ADD. Accordingly, when only a base address is set, access to the nonvolatile memory device 124 is made possible without a repeated active command.

FIG. 3 illustrates a relative address table 112 formed in the memory controller 115 in FIG. 1. As illustrated, the relative address table 112 may include a plurality of stream IDs and a last sending address corresponding to each of the stream IDs.

The memory controller 115 of FIG. 1 may allocate a stream ID according to a core or an application issuing an access request. Information on a last sending address corresponding to the stream ID may be stored in and updated to the relative address table 112. It will be assumed that a stream ID S_ID1 is allocated to an access request issued by a specific core of the host 110. Under the assumption, the memory controller 115 stores a last sending address corresponding to the stream ID S_ID1 in the relative address table 112. For example, the last sending address of the stream ID S_ID1 may be written as a base address '110' and a relative address '150'. Similarly, a last sending address corresponding to a stream ID S_ID4 may be stored in the relative address table 112. The last sending address of the stream ID S_ID4 may be written as a base address '240' and a relative address '300'. This may indicate a column position increasing from the base address '240' by '300'.

A relative addressing scheme may be used in such a manner that a relative address is subtracted from a base address. That is, not only a relative address but also signs (+ and −) indicating increase and decrease may be optionally added. That is, it will be assumed that a last sending address of a stream ID S_ID5 is a base address '500' provided with a relative address '200' and the sign '−'. Under the assumption, the last sending address may correspond to a column position '300' obtained by subtracting the relative address '200' from the base address '500'.

As described above, a stream ID is allocated to a single layer. However, a stream ID may also be allocated in a relative addressing scheme having a plurality of layers.

According to the above-described relative address table 112 of the host 100, a last sending address of each stream ID may be maintained and updated. Thus, when an additional access request is issued for the same stream ID with reference to the relative address table 112, a relative address may be generated based on a last sending address.

Figure 4:
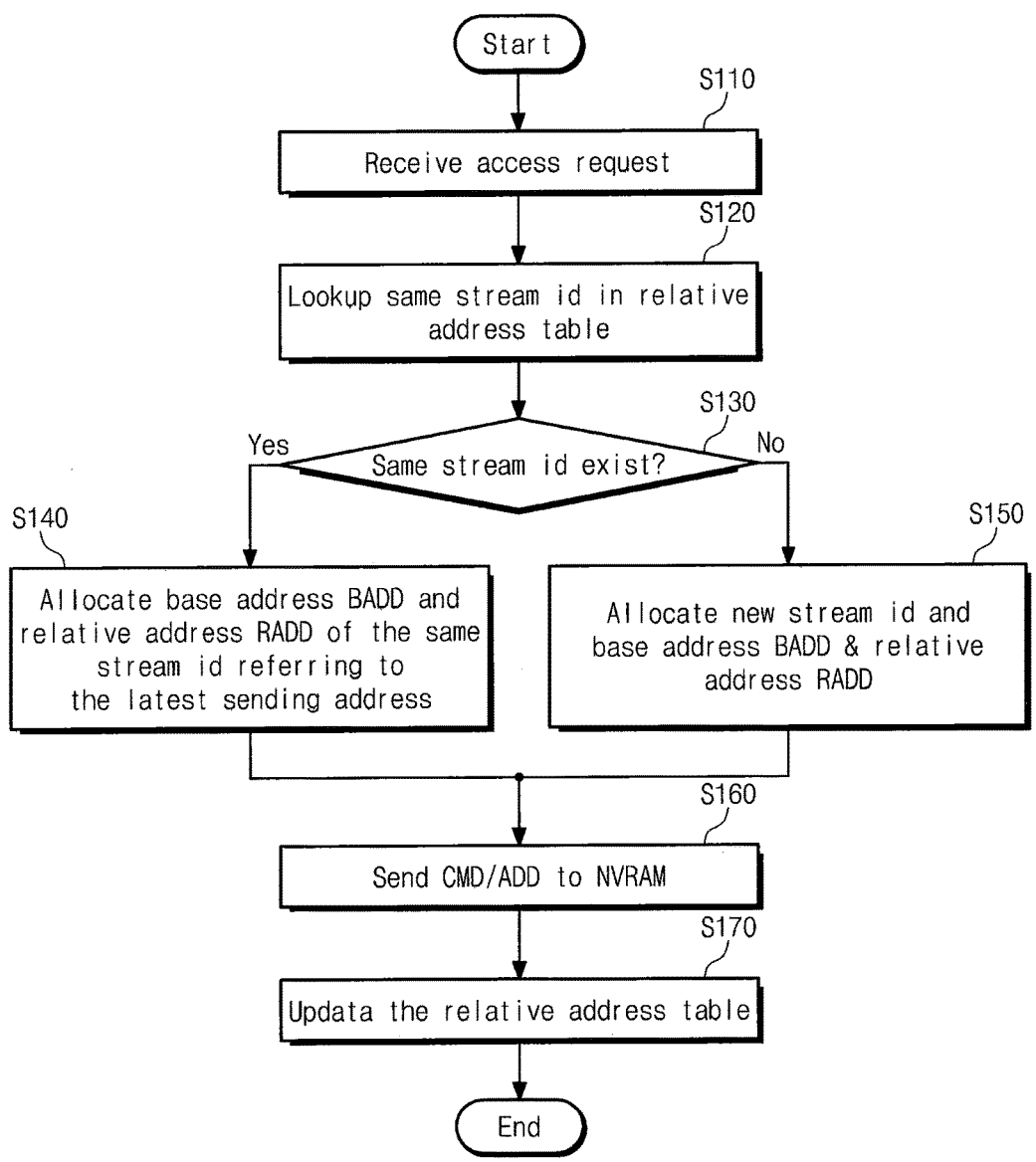
FIG. 4 is a flowchart summarizing a relative address generating method of a memory controller referring to a last sending address.

FIG. 4 is a flowchart summarizing a relative address generating method of the memory controller 115 of FIG. 1, referring to a last sending address. Referring to FIG. 4, the memory controller 115 may generate and manage a relative address based on a stream ID.

In S110, the memory controller 115 receives an access request for access to the nonvolatile RAM 120 from specific components of the host 110. For example, although not shown, the memory controller 115 may receive an access request from any one core of multi-core processing units. A specific stream ID may be allocated to an access request provided from a specific core.

In S120, the memory controller 115 looks up whether a specific stream ID exists in the relative address table 112. If an access request provided from the specific core also existed before, a stream ID corresponding to the specific core may exist in the relative address table 112. However, when an access request is first issued from the specific core, a stream ID corresponding to the specific core may not exist in the relative address table 112.

In S130, an operation branch occurs depending on whether there is the same stream ID as an access-requested stream ID to the relative address table 112. When there is the same stream ID as the access-requested stream ID (Yes direction), the flow proceeds to S140. Meanwhile, if there is no same address as the access-requested stream ID (No direction), the flow proceeds to S150.

In S140, the memory controller 115 may generate a base address of an access-requested position and a relative address with reference to the last sending address. That is, a combination position of the base address and the relative address of the last sending address may be generated as a base address, and/or a relative address may be generated with reference to a size of the access-requested data.

In S150, the memory controller 115 may allocate a new stream ID. And the memory controller 115 may generate a base address and a relative address corresponding to the new stream ID.

In S160, the memory controller 115 may send the generated address to the nonvolatile RAM 120. That is, the memory controller 115 may send a command/address for sending a stream ID and/or a command/address for sensing a base address and a relative address to the nonvolatile RAM 120.

In S170, the memory controller 150 may update the last sent stream ID, base address, and relative address to the relative address table 112.

So far, a method for generating a relative address in units of streams using the relative address table 112 executed in the host 110 has been described. However, it will be readily understood that a method for generating a relative address in a host is not limited to the above-described method. In a specific stream ID, a base address may be designed to always be a last sending relative address. Alternatively, the stream ID may be hierarchically set such as an upper stream and a lower stream. That is, a stream ID may be hierarchically divided depending on cores and threads issuing an access request.

Figure 5:
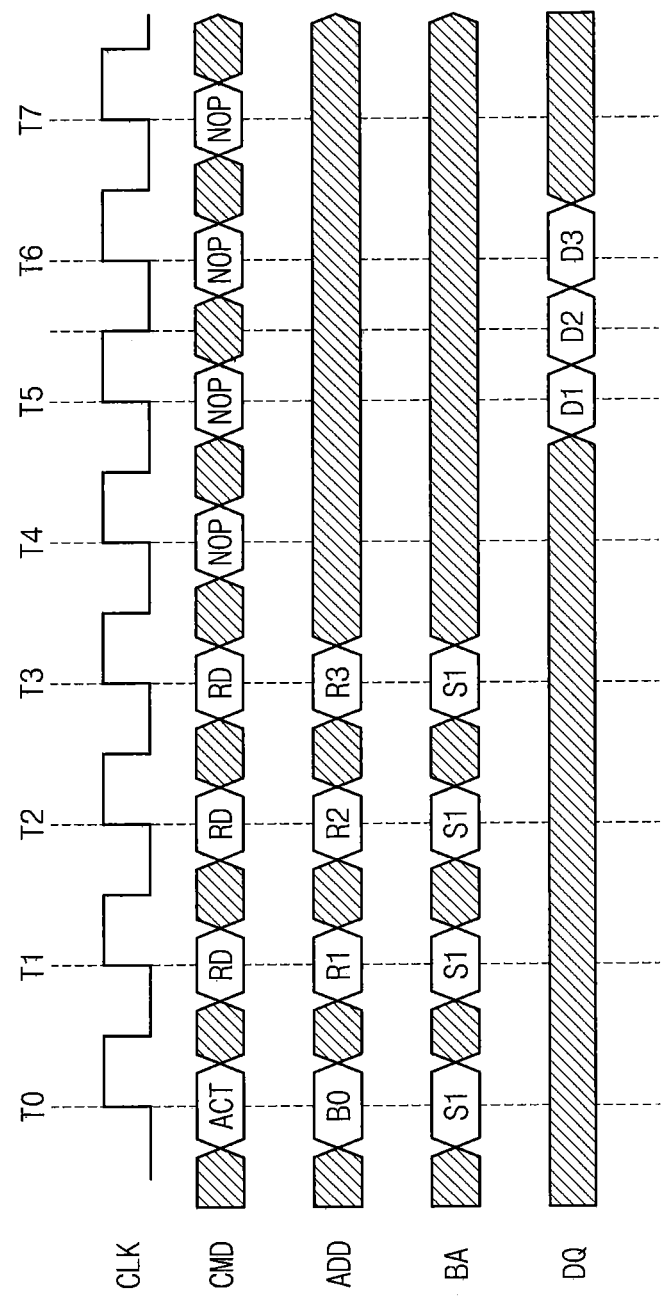
FIG. 5 is a timing diagram illustrating a command sequence where a memory controller according to example embodiments of inventive concepts accesses a nonvolatile RAM.

FIG. 5 is a timing diagram illustrating a command sequence where a memory controller 115 of FIG. 1 according to example embodiments of the inventive concepts accesses a nonvolatile RAM 120. Referring to FIG. 5, the memory controller 115 accesses the nonvolatile RAM 120 in a DRAM interface manner The memory controller 115 may set a stream ID S1 and a base address B0 using an active command ACT. In synchronization with an input cycle of the active command ACT, the stream ID S1 may be transmitted to an input cycle of a bank address BA (not shown) and the base address B0 may be transmitted to an input cycle of a row address. The base address B0 and the stream ID S1 may be simultaneously set at a time point T0.

Following input of the stream ID S1 and the base address B0, an input cycle of a read command RD and a relative address R1 may be executed at a time point T1. At this time point T1, the stream ID S1 may also be provided. At a time point T2, an input cycle of the read command RD and a relative address R2 is continued without providing an additional active command ACT. At a time point T3, an input cycle of the read command RD and the relative address R3 may be followed without providing an additional active command ACT.

The nonvolatile RAM 120 may sequentially output requested data D1, D2, and D3 in response to read requests using the above-mentioned relative addresses. In FIG. 5, it is shown that requested data is output to a single data output cycle. However, it will be readily understood that each of the data D1, D2, and D3 may correspond to a plurality of cycles.

So far, a method for sending a relative address using a DRAM interface has been described. Thus, compatibility with a DRAM may be provided and usage of a memory bus consumed to send an address may be reduced.

Figure 6:
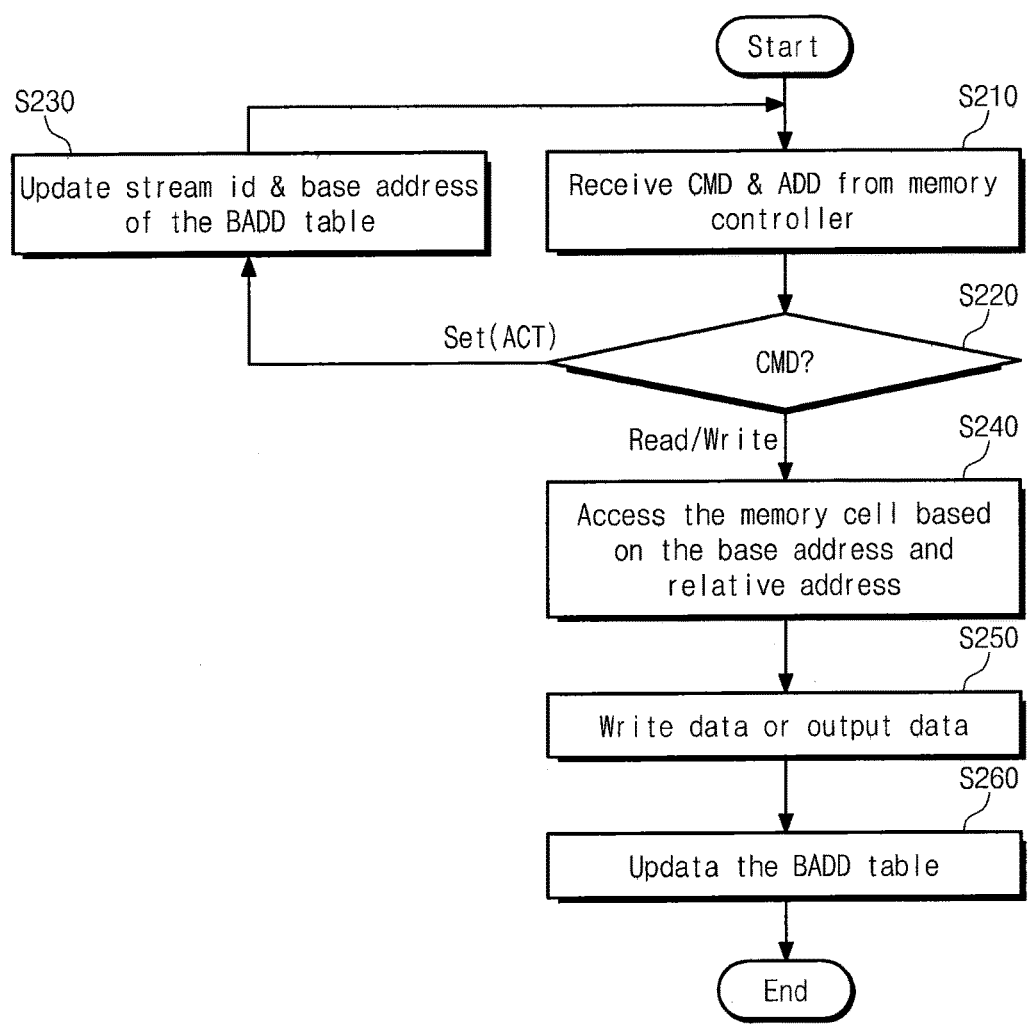
FIG. 6 is a flowchart summarizing operation of a nonvolatile RAM according to example embodiments of inventive concepts.

FIG. 6 is a flowchart summarizing operation of a nonvolatile RAM according to example embodiments of inventive concepts. Referring to FIG. 6, the device controller 122 of FIG. 1 may access a memory position corresponding to a relative address provided from the memory controller 115 by using the base address table 123.

In S210, the device controller 122 receives a command/address set sent in a command/address input cycle. The command/address set may include a cycle in which a stream ID and a base address are sent or a cycle in which a read/write command and a relative address are sent.

In S220, the device controller 122 performs an operation branch according to the type of a command CMD sent in the command/address input cycle. For example, when the command CMD is a set command (or ACT command) to set a new stream ID and the base address, the flow proceeds to S230. Meanwhile, when the command CMD is a read/write command to input a previously input stream ID and a relative address based on the base address, the flow proceeds to S240.

In S230, the device controller 122 may write the stream ID and the base address provided through the set command (or the ACT command) into the base address table 123. In this case, since the provided stream ID is a newly provided stream ID, the stream ID is registered in the base address table 123 and the base address may be newly set. Then, the flow returns to S210 to receive an access command accompanying the relative address.

In S240, the device controller 122 accesses a memory area indicated by a relative address input in synchronization with the read/write command. The device controller 122 may access a memory area of a column position increasing or decreasing by the input relative address on the basis of the base address registered in the base address table 123.

In S250, the device controller 122 may write data into a designated memory area or sense written data.

In S260, the device controller 122 may update the base address table 123 using a last input relative address. That is, the device controller 122 may update a base address of a corresponding stream ID using the last input relative address.

So far, a method for applying a relative address of the device controller 122 has been described. As described above, a base address and a stream ID are set through an active command. However, it will be readily understood that this example is merely an example embodiment of inputting a relative address. That is, a protocol for setting a base address and a relative address may be provided in various ways in additional to the above-described method.

Figure 7:
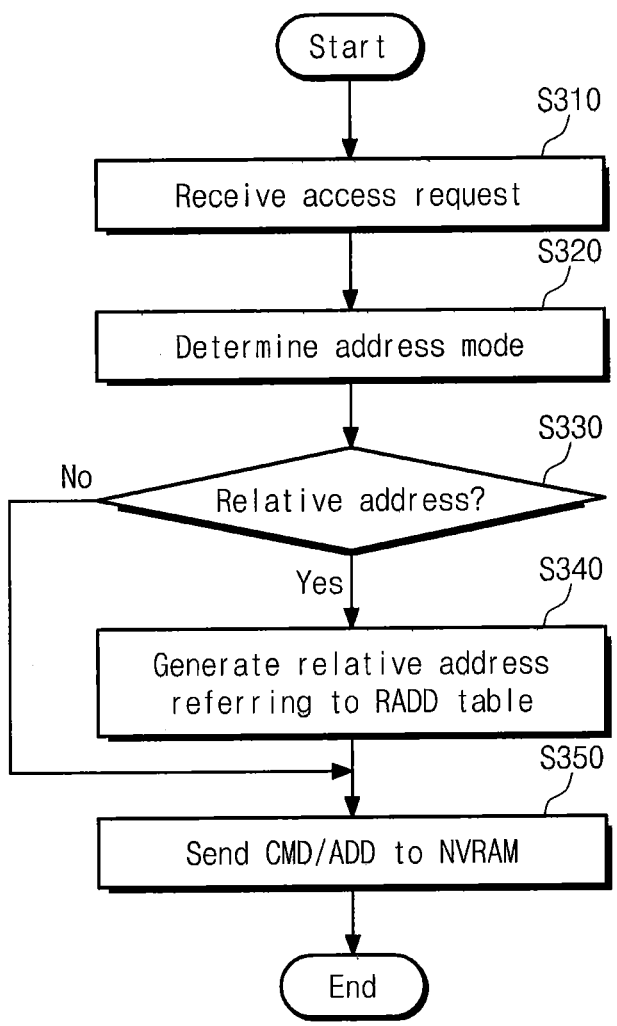
FIG. 7 is a flowchart illustrating an example of a memory system to which a relative addressing scheme according to example embodiments of inventive concepts and a conventional absolute addressing scheme are selectively applied.

FIG. 7 is a flowchart illustrating an example of a memory system to which a relative addressing scheme according to example embodiments of inventive concepts and/or a conventional absolute addressing scheme are selectively applied. Referring to FIG. 7, the memory controller 115 of FIG. 1 may determine whether or not to apply a relative address to an access request, according to predetermined criteria.

In S310, the memory controller 115 receives an access request for access to the nonvolatile RAM 120 provided from the host 110.

In S320, the memory controller 115 determines the address mode such that the memory controller 115 may determine whether to apply a relative address or an absolute address to the access request for access to the nonvolatile RAM 120. Addressing-type determination criteria may be variously set. For example, one of absolute addressing type and relative addressing type may be selected according to a setting environment such as BIOS of the host 110. Alternatively, the memory controller 115 may determine a state of the memory bus 130 to select an addressing manner for access to the nonvolatile RAM 120. That is, when usage of the memory bus 130 is relatively high, the memory controller 115 may select a relative addressing manner to enhance bus use efficiency. However, a selection criterion of the absolute addressing manner and the relative addressing manner is not limited thereto and an addressing manner may be selected according to various criteria.

In S330, an operation branch occurs depending on the addressing manner. When the selected addressing manner is a relative addressing manner (Yes direction), the flow proceeds to S340. Meanwhile, when the selected addressing manner is an absolute addressing manner (No direction), the flow proceeds to S350.

In S340, the memory controller 115 generates a relative address with reference to the relative address table 112. The memory controller 115 may look up the stream ID registered in the relative address table 112 and generate a base address and a relative address with reference to the last sending address.

In S350, the memory controller 115 may send an access command to the nonvolatile RAM 120 using a generated address. The memory controller 115 may send command/address to the nonvolatile RAM 120 according to the relative addressing manner or the absolute addressing manner. Also the memory controller 115 may provide a control signal or hint information to indicate the address mode, thus indicating whether access depends on the relative addressing manner or the absolute addressing manner, to the nonvolatile RAM 120.

So far, functions of the memory controller 115 selectively applying the relative addressing manner and the absolute addressing manner have been described. Although not shown in the drawing, it will be readily understood that there may be provided various means capable of recognizing an addressing manner provided by the memory controller 115 by the nonvolatile RAM 120.

Figure 8:
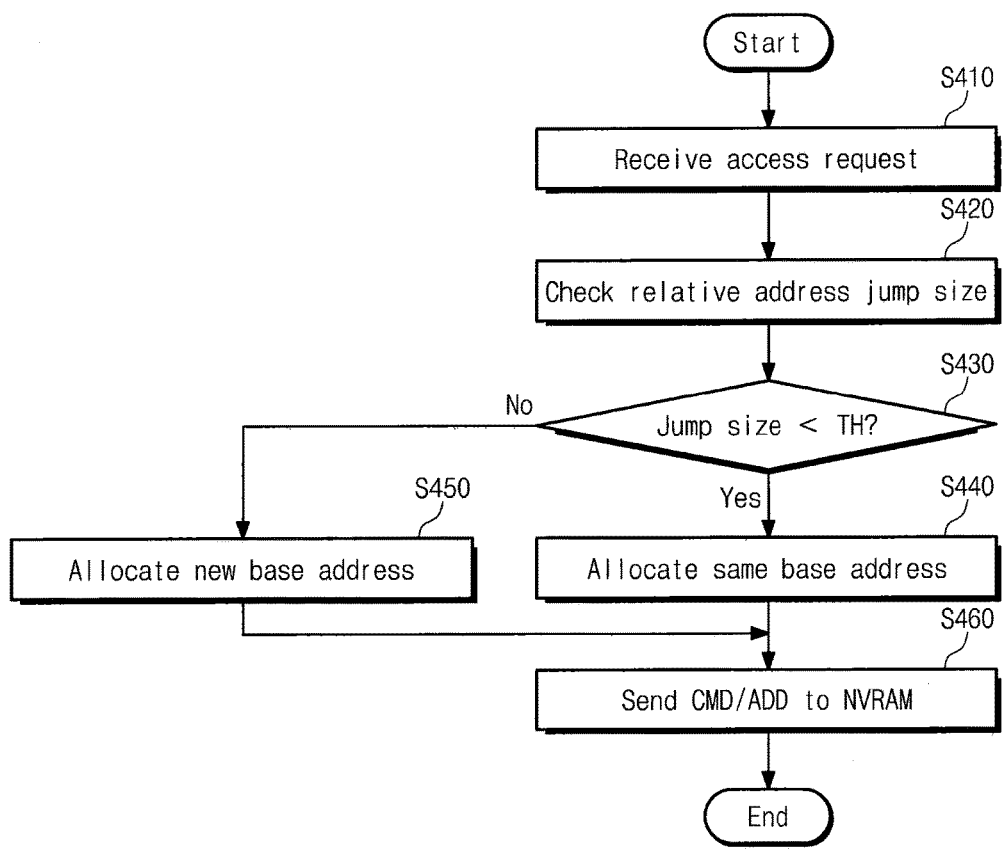
FIG. 8 is a flowchart illustrating another example of a relative address generating method of a memory controller.

FIG. 8 is a flowchart illustrating another example of a relative address generating method of a memory controller. Referring to FIG. 8, the memory controller 115 (see FIG. 1) may allocate a new base address in case of a relatively large-sized jump from a base address even when an access request for access to the same stream ID is issued.

In S410, the memory controller 115 may receive an access request for access to the nonvolatile RAM 120 provided from the host 110.

In S420, the memory controller 115 checks a jump size of a relative address corresponding to the access request.

In S430, the memory controller 115 may perform operation branch according to the jump size of the relative address. When the jump size is smaller than a threshold value TH (Yes direction), the flow proceeds to S440. When the jump size is greater than or equal to the threshold value TH (No direction), the flow proceeds to S450.

In S440, the memory controller 115 may maintain a base address for the corresponding stream ID at a value set by a last sending address or the same value as a previously sent base address.

In S450, the memory controller 115 may allocate the base address for the corresponding stream ID to a new value.

In S460, the memory controller 115 may send an access command to a nonvolatile RAM using a generated address.

So far, a method for setting a new base address according to a jump size of a relative address in the same stream ID has been described. However, it will be readily understood that a criterion to reset a base address to a new value in the same stream ID may vary depending on various conditions.

Figure 9:
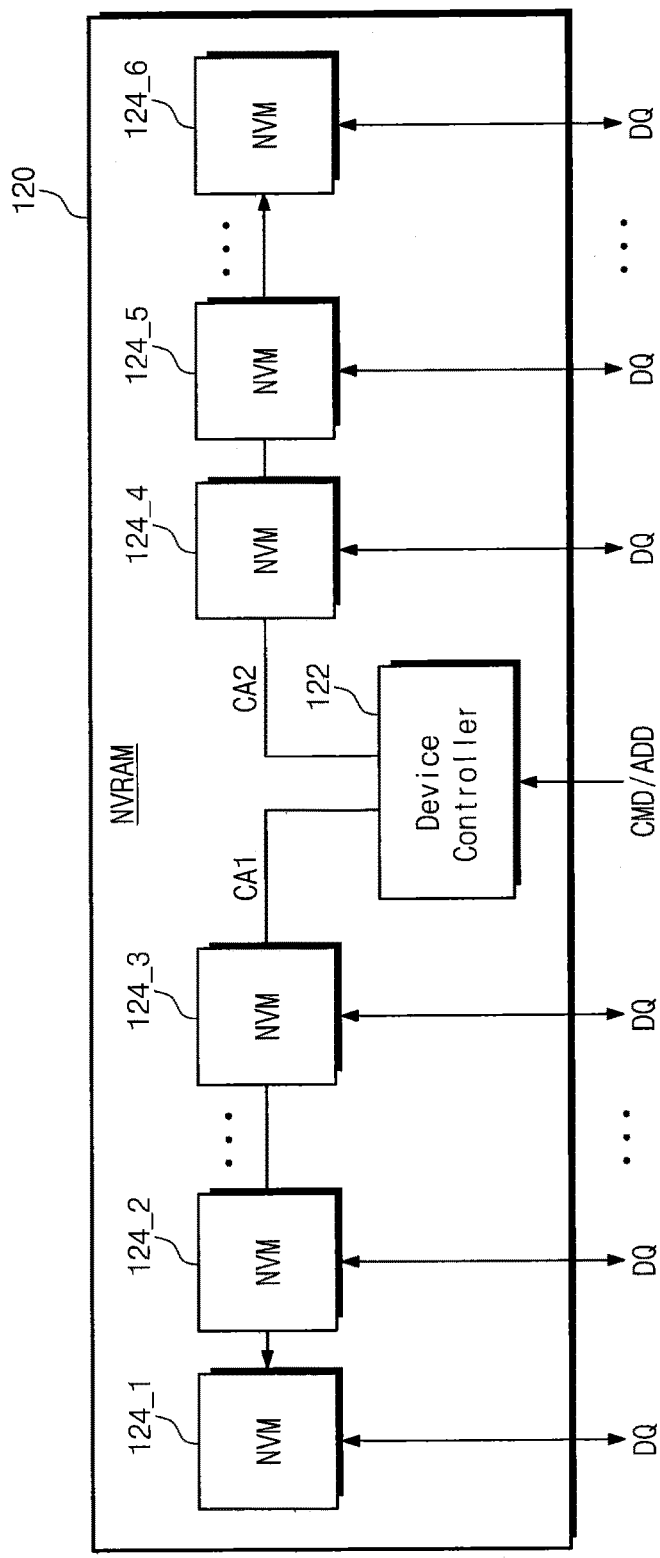
FIG. 9 is a block diagram illustrating an example of a nonvolatile RAM according to example embodiments of inventive concepts.

FIG. 9 is a block diagram illustrating an example of a nonvolatile RAM 120 of FIG. 1, according to example embodiments of inventive concepts. As illustrated, the nonvolatile RAM 120 may include a device controller 122 and a plurality of nonvolatile memory devices 124_1 to 124_6.

The nonvolatile memories 124_1 to 124_6 may be connected to data lines DQ and/or data strobe lines DQS of the memory bus 130 (see FIG. 1), respectively. For example, the nonvolatile memory device 124_1 may be directly connected to four (×4) data lines DQ. Although not shown in the drawing, data may be input or output to the nonvolatile memory device 124_1 according to one of the data strobe lines DQS allocated to the four data lines DQ. The other nonvolatile memory devices 124_2 to 124_6 may be connected to different data lines DQ and/or different data strobe lines DQS, respectively. The memory controller 15 of the host 110 may provide data to the nonvolatile memory devices 124_1 to 124_6 through the memory bus 130 and send a command or an address to the device controller 122.

The device controller 122 may receive command/address CMD/ADD provided from the memory controller 115 of the host 110. The device controller 122 may send the received command/address CMD/ADD to the nonvolatile memory devices 124_1 to 124_6. The device controller 122 may access the nonvolatile memory devices 124_1 to 124_6 with reference to a relative address, a stream ID, etc. provided from the memory controller 115.

Although not shown in the drawing, the nonvolatile RAM 120 may further include a plurality of DRAM devices constituting a bank, which are different from nonvolatile memory devices 124_1 to 124_6. Alternatively, the nonvolatile RAM 120 may further include nonvolatile memory devices used as a buffer of the nonvolatile memory devices 124_1 to 124_6. It will be readily understood that the nonvolatile RAM 120 may include DRAM devices and the nonvolatile memory devices 124_1 to 124_6 may be used to back up the DRAM devices. The nonvolatile RAM 120 may have a structure in which the data lines DQ are connected to the device controller 122 and data input by the device controller 122 is sent to the nonvolatile memory devices 124_1 to 124_6. Corresponding data buffers DBs may be included in the nonvolatile memory devices 124_1 to 124_6, respectively.

The data buffers DBs may receive a data signal DQ and/or a data strobe signal DQS from the host 110 and send the received signals DQ and DQS to the nonvolatile memory devices 124_1 to 124_6. In general, the nonvolatile RAM 120 may have a structure compatible with, for example, a load reduced DIMM (LRDIMM) according to existence of the data buffers DBs.

The nonvolatile memory devices 124_1 to 124_6 may be provided as, for example, one or more flash memories. Alternatively, the nonvolatile memory devices 124_1 to 124_6 may be implemented with various nonvolatile memory devices such as electrically erasable and programmable ROM (EEPROM), NAND flash memory, NOR flash memory, phase-change RAM (PRAM), resistive RAM (ReRAM), ferroelectric RAM (FRAM), and spin-transfer torque magnetic RAM (STT-MRAM).

Figure 10:
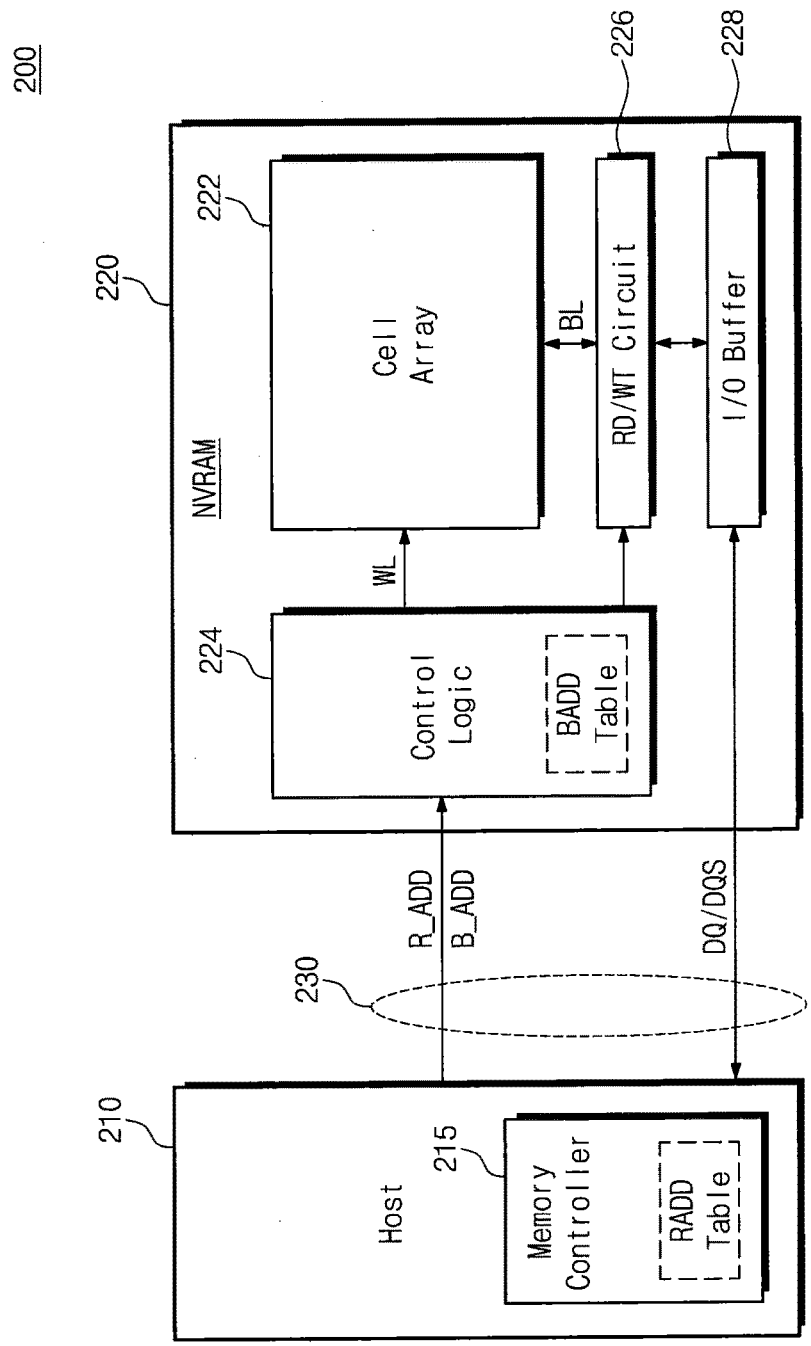
FIG. 10 is a block diagram illustrating another example of a memory system according to example embodiments of inventive concepts.

FIG. 10 is a block diagram illustrating another example of a memory system according to example embodiments of inventive concepts. Referring to FIG. 10, a memory system 200 includes a host 210 and a nonvolatile RAM 220 connected to a memory bus 230. The nonvolatile RAM 220 may be provided in the form of a single memory device, a memory card or a solid state drive (SSD). The host 210 accesses the nonvolatile RAM 220 using a stream ID S_ID and a relative address R_ADD. Functions or configurations of the host 210 are substantially identical to those shown in FIG. 1 and will not be described in further detail.

The nonvolatile RAM 220 may include a cell array 222, a control logic 224, a read/write circuit 226, and an input/output circuit 228. The cell array 222 may include a nonvolatile memory device. For example, the memory cell array 222 may include a nonvolatile memory device such as electrically erasable and programmable ROM (EEPROM), NAND flash memory, NOR flash memory, phase-change RAM (PRAM), resistive RAM (ReRAM), ferroelectric RAM (FRAM), and spin-transfer torque magnetic RAM (STT-MRAM).

The control logic 224 may access the cell array 222 using the stream ID S_ID and the relative address R_ADD provided from the host 210. The control logic 224 may decode at least one of the stream ID S_ID, a base address B_ADD, and the relative addresses R_ADD to select a row and a column. The control logic 224 may select a wordline and a bitline corresponding to the selected row and the selected column. The control logic 224 may include a base address table BADD Table to decode the stream ID S_ID, the base address B_ADD, and the relative address R_ADD. The base address table BADD Table may store and update the stream ID S_ID, the base address B_ADD, and the relative address R_ADD.

The read/write circuit 226 writes data into the cell array 222 through a bitline BL of a selected column or senses written data. The input/output buffer 228 transmits data DQ provided through the data bus 230 to the read/write circuit 226. The input/output buffer 228 transmits the data provided from the read/write circuit 226 to the memory bus 230.

Figure 11:
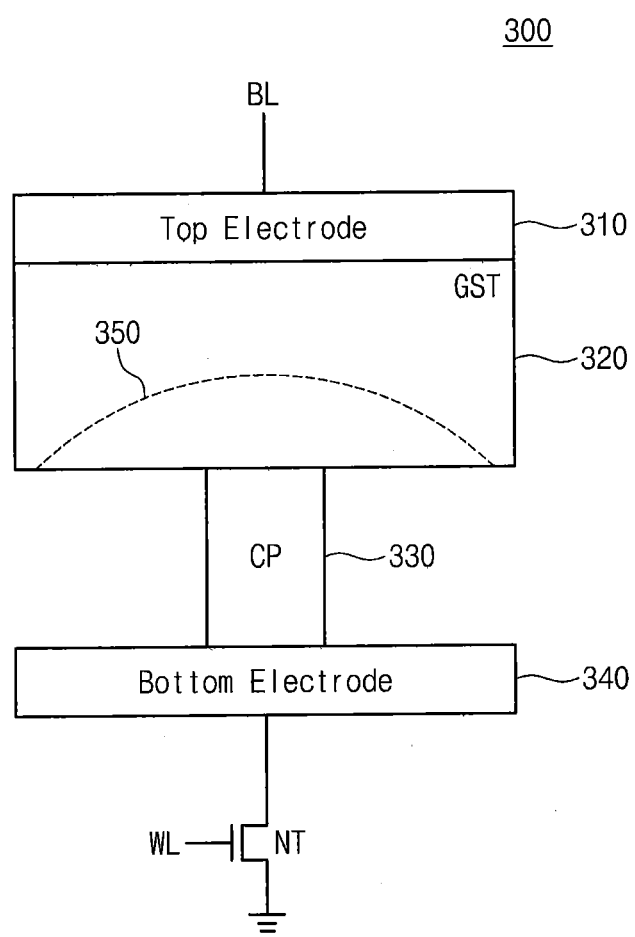
FIG. 11 illustrates cell structure and physical properties of a phase-change memory device according to example embodiments of inventive concepts.

FIG. 11 illustrates cell structure and physical properties of a phase-change memory device according to example embodiments of inventive concepts. Referring to FIG. 11, a memory cell 300 includes a variable resistor and an access transistor NT. The variable resistor includes a top electrode 310, a phase change material 320, a contact plug (CP) 330, and a bottom electrode 340. The top electrode 310 is connected to a bitline BL. The bottom electrode 340 is coupled between the contact plug 330 and an access transistor NT. The contact plug 330 is made of a conductive material (e.g., TiN) and is also referred to as a heater plug. The phase change material 320 is disposed between the top electrode 310 and the contact plug 330. The state of the phase change material 320 is variable depending on amplitude, duration, and falling time of a supplied current pulse. A phase of the phase change material corresponding to set or reset is decided by amorphous volume 350, as shown in this drawing. In general, an amorphous phase corresponds to a reset state and a crystal phase corresponds to a set state. Amorphous volume decreases with transition from an amorphous state to a crystal state. The phase change material 320 has resistance that varies depending on the amorphous volume 350. That is, written data is decided depending on the amorphous volume 350 of the phase change material 320 formed according to different current pulses.

Figure 12:
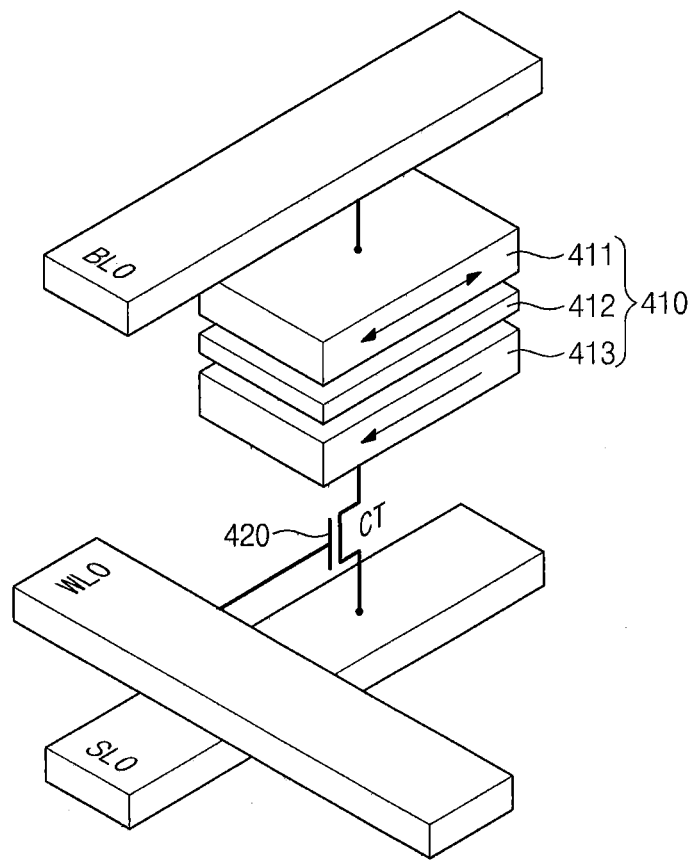
FIGS. 12 and 13 illustrate a memory cell included in a nonvolatile RAM according to example embodiments of inventive concepts.
Figure 13:
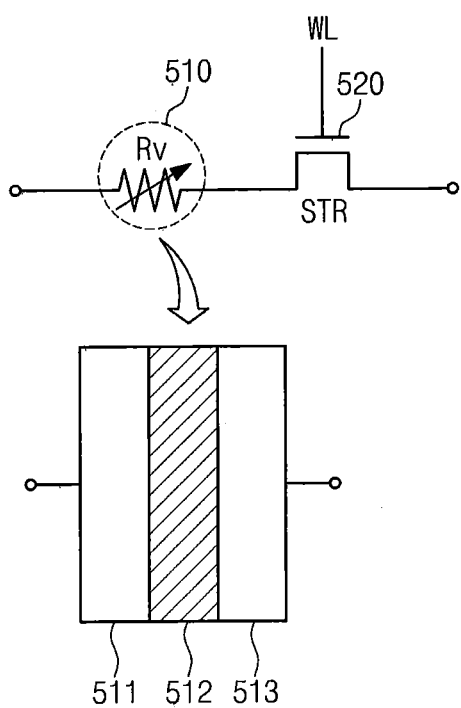

FIGS. 12 and 13 illustrate a memory cell included in a nonvolatile RAM according to example embodiments of inventive concepts. A cell structure of a spin-transfer torque magneto-resistive random access memory (STT-MRAM) is three-dimensionally shown in FIG. 12, and a cell structure of a resistive RAM is illustrated in FIG. 13.

Referring to FIG. 12, a memory cell 400 of an STT-MRAM in shown as a memory cell of a nonvolatile RAM. The memory cell 400 may include a magnetic tunnel junction (hereinafter referred to as "MTJ") element 410 and a cell transistor (CT) 420. A wordline WL0 may be connected to a gate of the cell transistor 420. One end of the cell transistor 420 is connected to a bitline BL0 via the MTJ element 410, and the other end thereof is connected to a source line SL0.

The MTJ element 410 may include a pinned layer 413, a free layer 411, and a tunnel layer 412 disposed therebetween. A magnetization direction of the pinned layer 413 may be fixed, and a magnetization direction of the free layer 411 may be identical to or opposite to the magnetization direction of the pinned layer 413. For example, an antiferromagnetic layer (not shown) may be further provided to fix the magnetization direction of the pinned layer 413.

To perform a write operation of the STT-MRAM 400, a voltage is applied to the wordline WL0 to turn on the cell transistor 420 and write current is applied between the bitline BL0 and the source line SL0. To perform a read operation of the STT-MRAM 400, a turn-on voltage is applied to the wordline WL0 to turn on the cell transistor 420 and read current is applied from the bitline BL0 in a direction of the source line SL0 to determine data stored in the cell transistor 420 according to a measured resistance.

FIG. 13 is a circuit diagram of a memory cell 500 of a resistive memory device. As illustrated, the memory cell 500 includes a variable resistive element (Rv) 510 and a selection element (STR) 520.

The variable resistive element 510 includes a resistive material to store data. The selection element 520 may supply current to the variable resistance element 510 or block current supplied to the variable resistance element 510. The selection element 520 may include an NMOS transistor, as shown in FIG. 13. However, the selection element 520 may include a PMOS transistor or any one of switch elements such as a diode.

The variable resistance element (Rv) 510 includes a pair of electrodes 511 and 513 and a data storage layer 512 disposed between the electrodes 511 and 513. The data storage layer 512 may be made of a bipolar resistance memory material or a unipolar resistance memory material. The bipolar resistance memory material is programmed to a set or a reset state by the polarity of a pulse. The unipolar resistance memory material may be programmed to a set or reset state by a pulse of the same polarity. The unipolar resistance memory material may include single transition metal oxide such as NiOx and TiOx. The bipolar resistance memory material may include Perovskite-based materials.

So far, an STT-MRAM and an RRAM have been briefly described as examples of a memory cell constituting a nonvolatile RAM. However, it will be readily understood that the memory cell constituting a nonvolatile RAM according to example embodiment of inventive concepts is not limited thereto. That is, the memory cell of the nonvolatile RAM may be provided in the form of any one of flash memory, PRAM, MRAM, and/or FRAM.

Figure 14:
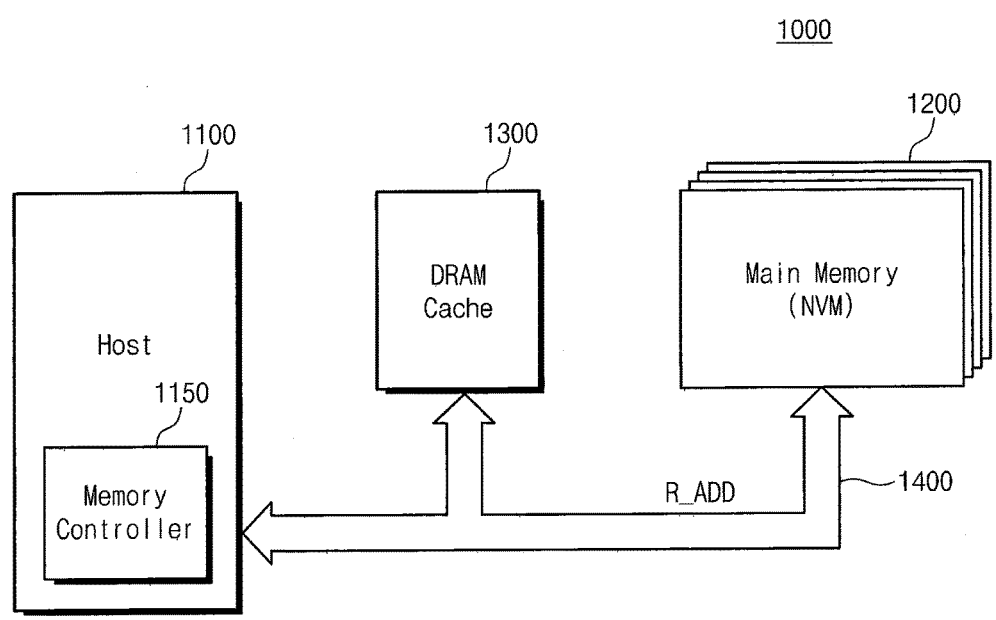
FIG. 14 is a block diagram of a memory system using a nonvolatile RAM employing a relative addressing scheme according to example embodiments of inventive concepts as a main memory.

FIG. 14 is a block diagram of a memory system 1000 using a nonvolatile RAM employing a relative addressing scheme according to example embodiments of inventive concepts as a main memory. As illustrated, the memory system 1000 may include a host 1100, a DRAM cache 1300, and a main memory 1200 connected through a memory bus 1400. The main memory 1200 may have substantially the same configuration as the nonvolatile RAM 120 described with reference to FIG. 1.

The host 1100 may write data into the main memory 1200 or read data stored in the main memory 1200. The host 1100 may load data in the main memory 1200 and perform various operations using the loaded data. For example, the host 1100 may include a central processing unit (CPU) to control the memory system 1000.

The host 1100 may include a memory controller 1150 to control the DRAM cache 1300 and/or the main memory 1200. The host 1100 may transmit a read request to the memory controller 1150 to read data stored in the main memory 1200. The memory controller 1150 may access the main memory 1200 to read data that the host 1100 requests. At this point, the memory controller 1150 may access the main memory 1200 using a relative address explained with reference to FIG. 1.

In particular, the memory controller 1150 uses the DRAM cache 1300 as a cache memory of the main memory 1200. That is, the memory controller 1150 may store data stored in the main memory 1200 in a cache line of the DRAM cache 1300. In some embodiments, instead of accessing the main memory 1200, the memory controller 1150 may access the cache memory. Since the memory controller 1150 shares the DRAM cache 1300 and the memory bus 1400, the memory controller 1150 may send a stream ID S_ID and a base address B_ADD to the main memory 1200 using an active command ACT. Also the memory controller may provide a relative address R_ADD to the main memory 1200 using read/write command.

The main memory 1200 may be provided as a memory device or a memory module including a nonvolatile memory. The main memory 1200 may include memory devices that may achieve large scale more easily than the DRAM cache 1300. The main memory 1200 may include an overwritable nonvolatile memory device or a non-overwritable memory. The main memory 1200 may be provided as, for example, a plurality of flash memories. In example embodiments, the main memory 1200 may be implemented with various nonvolatile memory device such as an electrically erasable and programmable ROM (EEPROM), a NAND flash memory, a NOR flash memory, a phase-change RAM (PRAM), a resistive RAM (ReRAM), a ferroelectric RAM (FRAM), and/or a spin-transfer torque magnetic RAM (STT-MRAM).

A DRAM, a nonvolatile memory device, and a memory controller according to example embodiments of inventive concepts may be packaged as one of various types to be subsequently embedded. For example, volatile and nonvolatile memory devices and/or a memory controller according to example embodiments of inventive concepts may be packaged by one of PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), and Wafer-Level Processed Stack Package (WSP).

According to example embodiments of inventive concepts, access to a nonvolatile memory device may be achieved using a relative addressing scheme to provide compatibility with an interface of a conventional main memory and high access speed.

The above-disclosed subject matter is to be considered illustrative, and not restrictive, and the appended claims are intended to cover all such modifications, enhancements, and other features, which fall within the true spirit and scope of inventive concepts. Thus, to the maximum extent allowed by law, the scope of inventive concepts is to be determined by the broadest permissible interpretation of the following claims and their equivalents, and shall not be restricted or limited by the foregoing detailed description. While some example embodiments have been particularly shown and described, it will be understood by one of ordinary skill in the art that variations in form and detail may be made therein without departing from the spirit and scope of the claims.

What is claimed is:

1. A method for accessing a random-accessible nonvolatile RAM, comprising:
   receiving a base address together with a stream ID;
   receiving a relative address corresponding to an increasing or decreasing size from the base address, wherein the stream ID is received together with the relative address;
   reading data stored in a memory area of the nonvolatile RAM or writing externally provided data into the memory area of the nonvolatile RAM with reference to the base address and the relative address; and
   storing a last sending address using the relative address and the base address,
   wherein the base address and the stream ID are received by the nonvolatile RAM using an active command, and
   wherein the access command corresponding to the stream ID was sent without an additional active command.

2. The method of claim 1,
   wherein the base address is received in an input sequence of a row address, and
   wherein the stream ID is received in an input sequence of a bank address.

3. The method of claim 1, wherein the receiving the relative address comprises sending the relative address that is received to the nonvolatile RAM using a read or write command.

4. The method of claim 1, further comprising:
   receiving a value indicating an increase or a decrease by the relative address from the base address.

5. The method of claim 1, wherein:
   the nonvolatile RAM includes at least one of an electrically erasable and programmable ROM (EEPROM), a NAND flash memory, a NOR flash memory, a phase-change RAM (PRAM), a resistive RAM (ReRAM), a ferroelectric RAM (FRAM), and/or a spin-transfer torque magnetic RAM (STT-MRAM).

6. A method for accessing a random-accessible nonvolatile RAM, comprising:
   receiving an access request for access to the nonvolatile RAM;
   determining whether to send the access request in a relative addressing scheme using a relative address or in an absolute addressing scheme;
   determining whether a stream ID corresponding to the access request is in a relative address table;
   generating a base address and a relative address corresponding to an increase or decrease size from the base address with reference to a last sending address corresponding to the stream ID when the stream ID exists in the relative address table; and
   sending the base address and the relative address to the nonvolatile RAM.

7. The method of claim 6,
   wherein the base address is sent together with an active command, and
   wherein the relative address is sent together with a read or write command.

8. The method of claim 7, wherein the stream ID is sent together with the active command.

9. The method of claim 6, further comprising:
   allocating the base address to a new value when the relative address is greater than a threshold value.

10. The method of claim 6, further comprising:
    storing the base address and the relative address sent to the nonvolatile RAM in the relative address table as a last sending address.

11. A method for accessing a random-accessible nonvolatile RAM, the method comprising:
    receiving a set command indicating an operation for accessing the nonvolatile RAM;
    receiving a base address in a same clock cycle as the receiving the set command;
    receiving a stream ID in the same clock cycle as the receiving the set command and the receiving the base address, wherein the stream ID corresponds to characteristics of a read/write command;
    receiving, a relative address indicating an offset from the base address;
    using a base address table to decode an access location in the nonvolatile RAM based on the base address, the relative address, and the stream ID; and
    accessing the access location in the nonvolatile RAM based on the base address and relative address.

12. The method of claim 11,
    wherein the read/write command comprises a read request or a write operation,
    wherein the read/write command is received prior to receiving an additional set command,
    wherein the read/write command is received after receiving the base address, and
    wherein the relative address is received in a same clock cycle as the read/write command.

13. The method of claim 11, the method further comprising:
    receiving a read/write command indicating an operation for accessing the nonvolatile RAM, the read/write command comprising a read request;

determining an access address of the access location in the nonvolatile RAM based on one of a positive offset by the relative address from the base address or a negative offset by the relative address from the base address; and providing data from the access location in the nonvolatile RAM responsive to the read request and the access address of the access location in the nonvolatile RAM.

14. The method of claim 11, wherein the relative address comprises a first relative address, wherein the offset from the base address comprises a first offset from the base address, wherein the access address comprises a first access address, wherein the access location comprises a first access location, and wherein the data comprises a first data, the method further comprising:

receiving, prior to receiving an additional set command, a second relative address indicating a second offset from the base address;

determining a second access address of the second access location in the nonvolatile RAM based on one of a positive offset by the second relative address from the base address or a negative offset by the second relative address from the base address; and providing second data from the second access location in the nonvolatile RAM responsive to the read request and the second access address of the second access location in the nonvolatile RAM.

\* \* \* \* \*